United States Patent [19]

Sinha

[11] Patent Number: 4,705,979
[45] Date of Patent: Nov. 10, 1987

[54] STRESS AND TEMPERATURE COMPENSATED SURFACE ACOUSTIC WAVE DEVICES

[75] Inventor: Bikash K. Sinha, West Redding, Conn.

[73] Assignee: Schlumberger Technology Corporation, New York, N.Y.

[21] Appl. No.: 749,289

[22] Filed: Jun. 26, 1985

[51] Int. Cl.$^4$ .............................................. H01L 41/08
[52] U.S. Cl. ................................. 310/313 A; 333/155
[58] Field of Search ..................................... 310/313 A; 333/150–155, 193–196

[56] References Cited

U.S. PATENT DOCUMENTS

| | | | |
|---|---|---|---|
| 3,771,072 | 11/1973 | Slobodnik | 333/30 R |
| 3,772,618 | 11/1973 | Slobodnik et al. | 333/30 R |
| 3,818,382 | 6/1974 | Holland et al. | 333/10 |
| 3,866,153 | 2/1975 | Slobodnik et al. | 333/30 R |
| 3,987,377 | 10/1976 | Kuroda et al. | 310/313 A X |
| 3,995,240 | 11/1976 | Kerbel | 333/30 R |
| 4,006,435 | 2/1977 | Kerbel | 310/313 A |
| 4,109,172 | 8/1978 | O'Connell | 310/313 |
| 4,109,173 | 8/1978 | O'Connell | 310/313 |
| 4,220,888 | 9/1980 | Gagnepain et al. | 310/361 |
| 4,224,548 | 9/1980 | O'Connell | 310/360 |
| 4,224,549 | 9/1980 | O'Connell | 310/360 |
| 4,323,809 | 4/1982 | O'Connell | 310/313 A |
| 4,419,600 | 12/1983 | Sinha | 310/361 |
| 4,489,289 | 12/1984 | Slobodnik | 331/107 A |
| 4,499,395 | 2/1985 | Kahan | 310/361 |
| 4,512,198 | 4/1985 | Sinha et al. | 73/703 |

OTHER PUBLICATIONS

"Standards on Piezoelectric Crystals, 1949: Standard 49 IRE 14.S1," Proceedings of the IEEE, Dec. 1949, pp. 1378–1390.

Slobodnik, A. J. Jr., "A Digitally Compensated SAW Oscillator," 1981 Ultrasonics Symposium Proceedings, IEEE Catalog 81CH1689-9, pp. 135–138.

Primary Examiner—Mark O. Budd
Attorney, Agent, or Firm—Cooper, Dunham, Griffin & Moran

[57] ABSTRACT

Disclosed is a rotated Y-cut, quartz SAW device having a propagation direction gamma and an angular orientation theta selected both for stress compensation and temperature compensation. In a particular embodiment gamma is 46.9° and theta is 41.8°.

32 Claims, 24 Drawing Figures

Figure 13

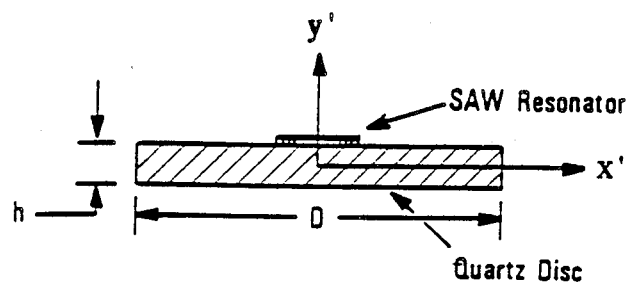
Figure 9-a
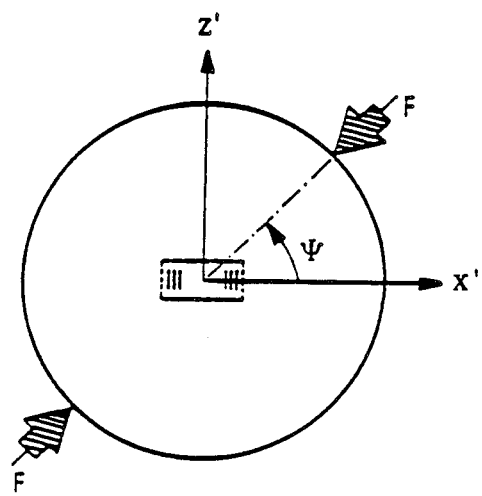
Figure 9-b

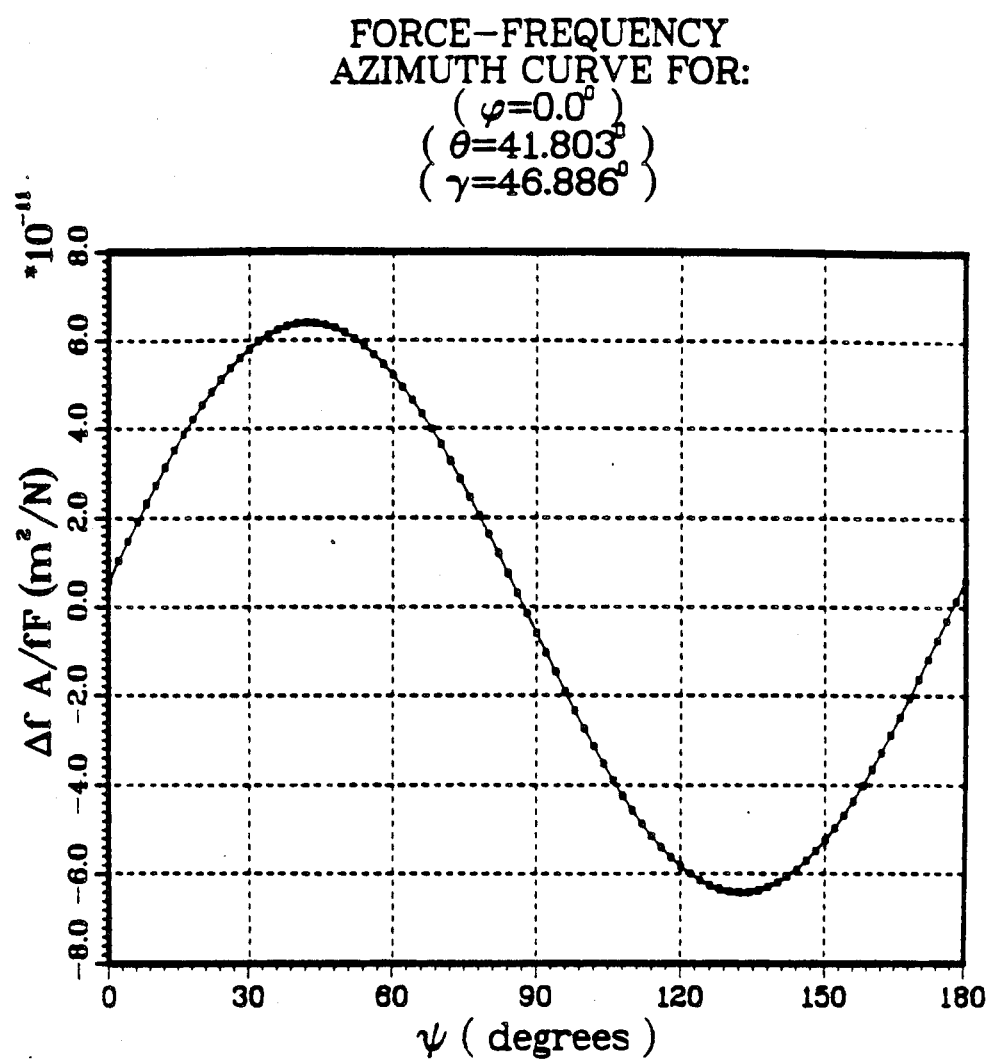
Figure 9-c

*A Two Port Saw Resonator*
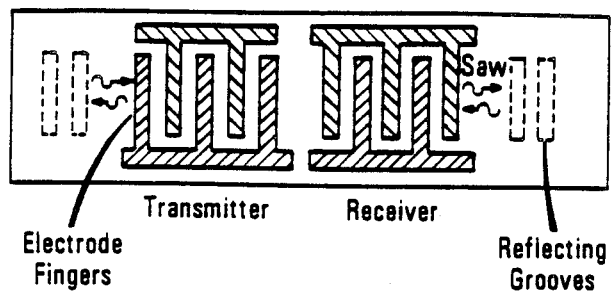
Figure 10-a
*A Periodic Array of Electrodes on a Substrate*
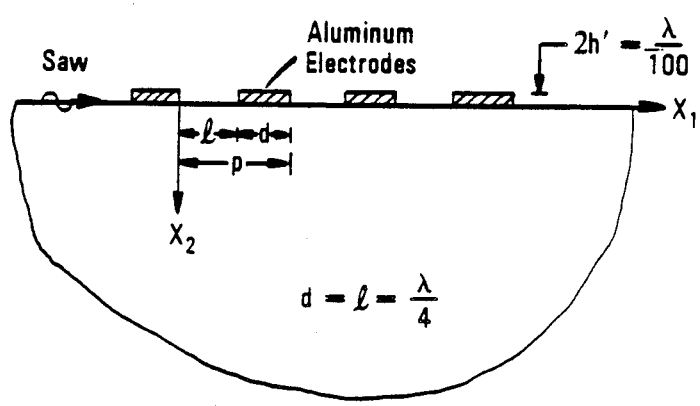
Figure 10-b

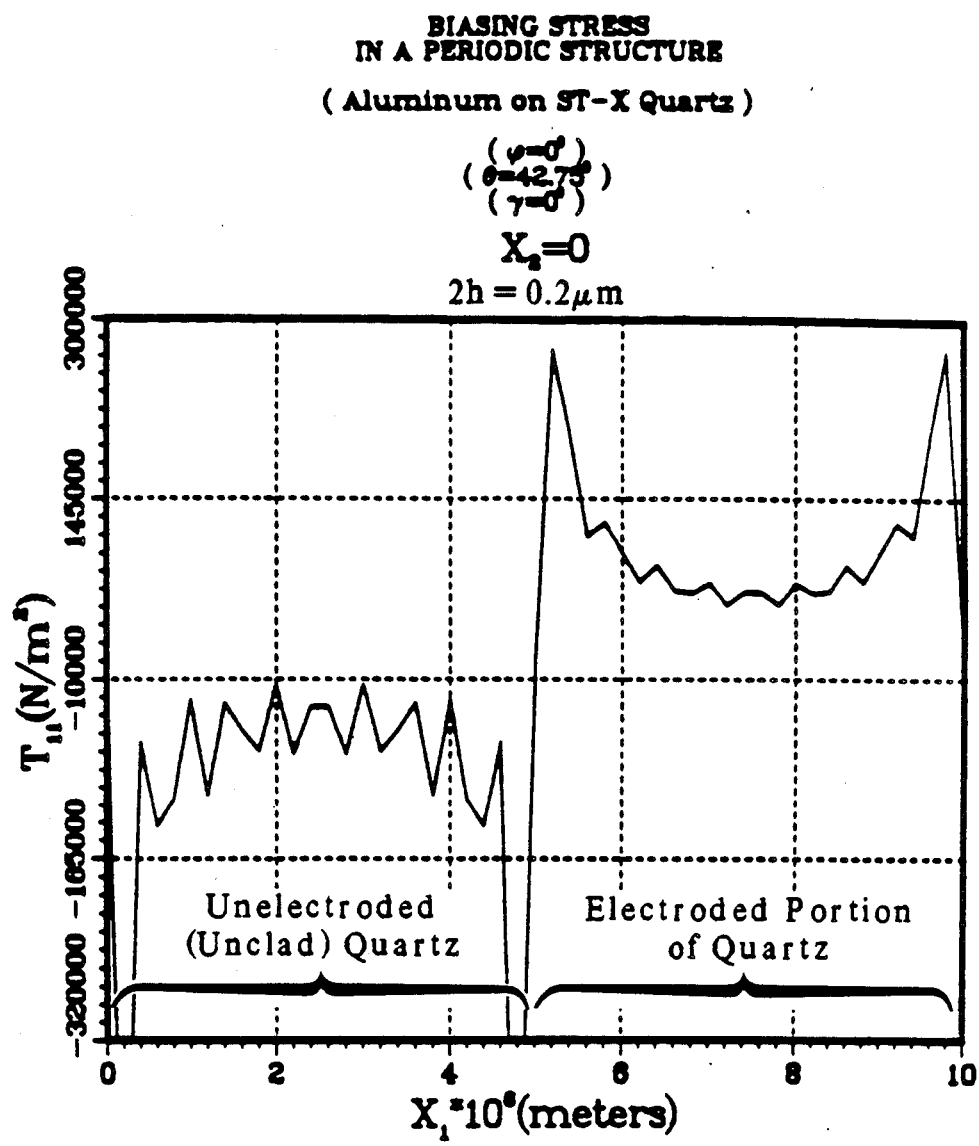
Figure 10-c

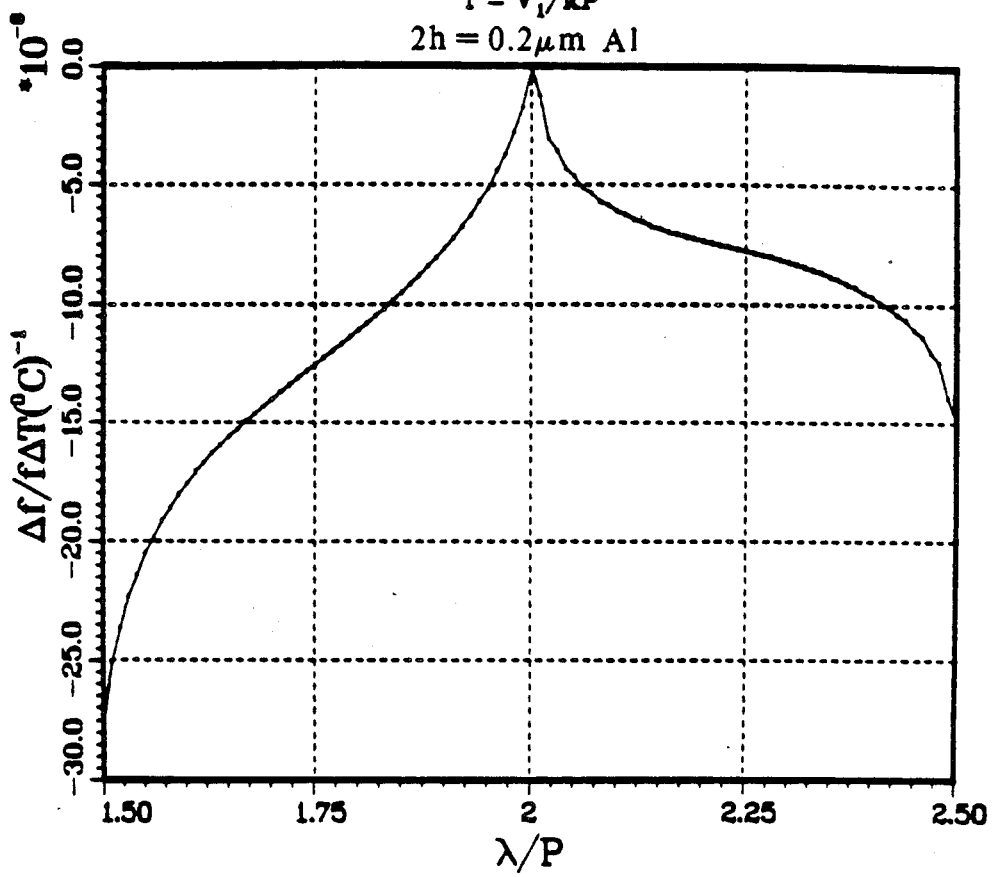
Figure 14-a

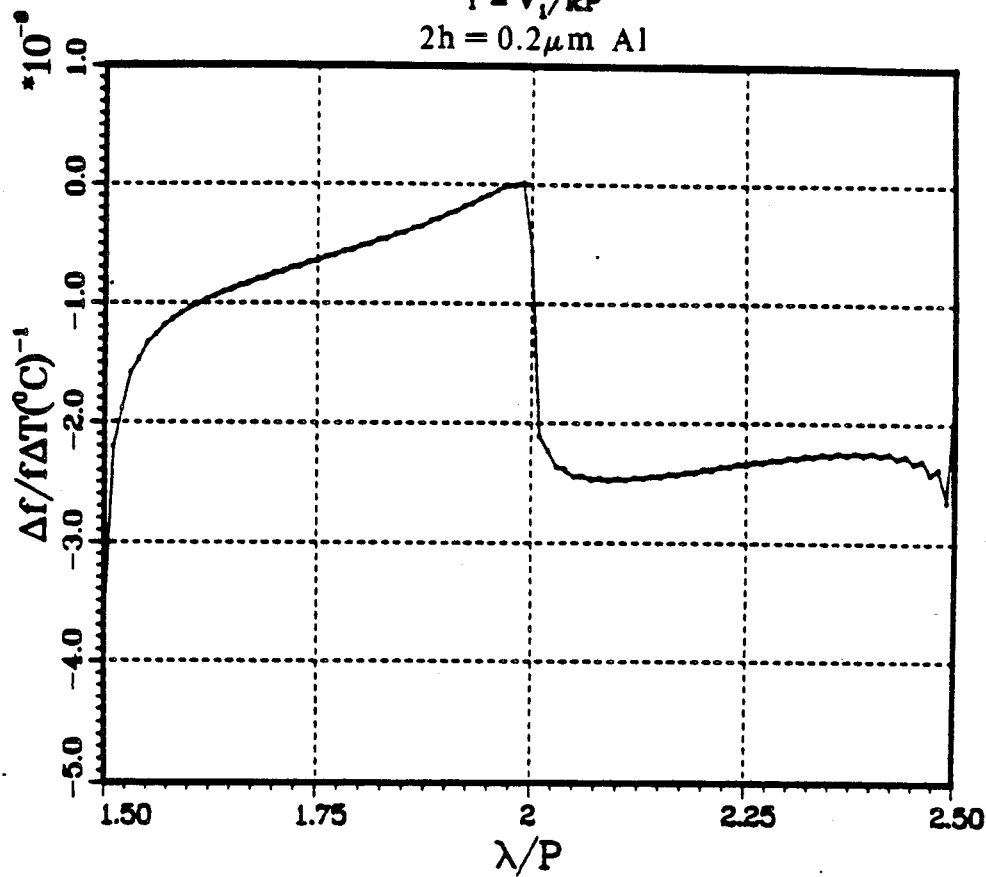
Figure 14-b

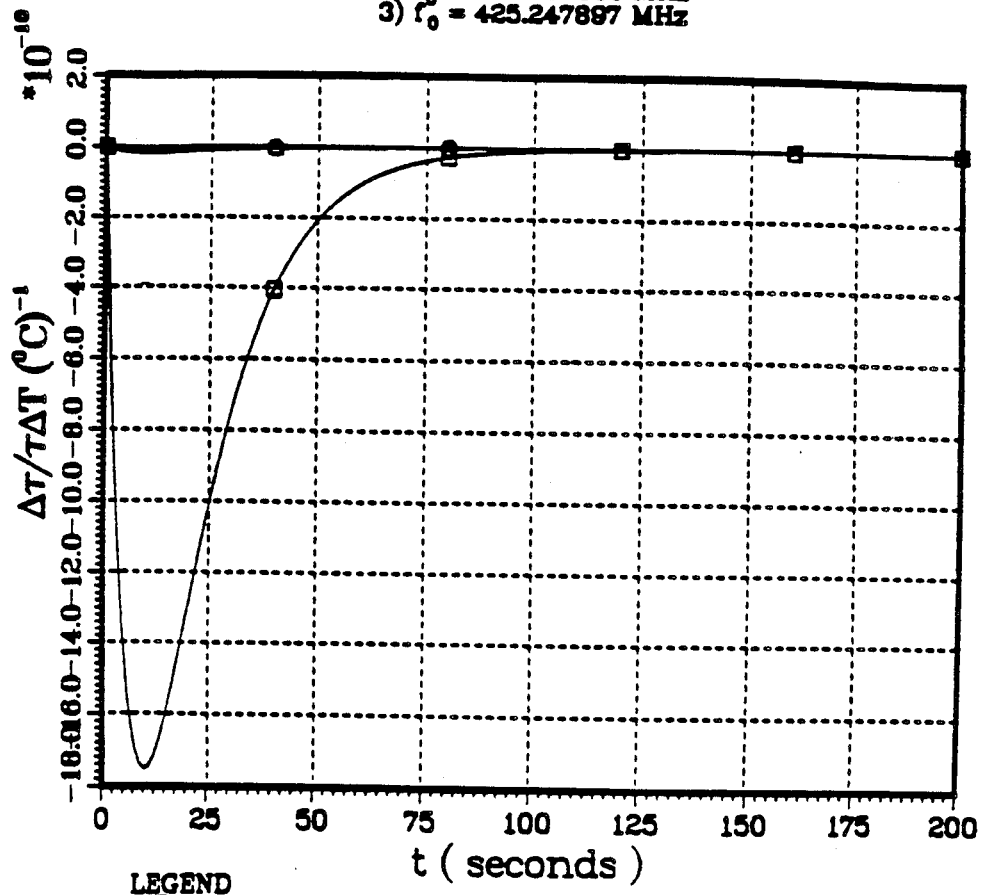
Figure 15-a

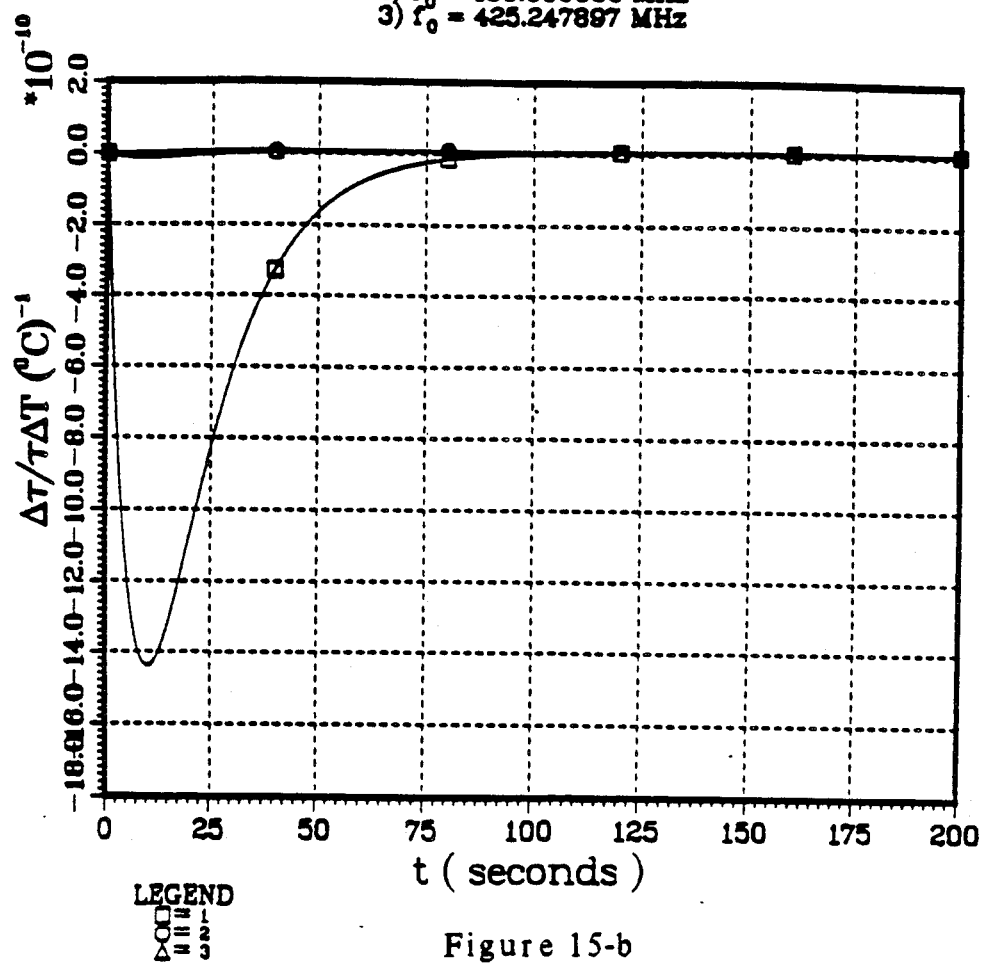
Figure 15-b

STRESS AND TEMPERATURE COMPENSATED SURFACE ACOUSTIC WAVE DEVICES

BACKGROUND AND SUMMARY OF THE INVENTION

The invention is in the field of surface acoustic wave (SAW) devices. It relates to improving the accuracy of such devices, and to a crystal having an angular orientation and a propagation direction which provide particularly advantageous compensation for stress and temperature effects in such devices.

SAW devices, such as resonators and delay lines, are used in sensors for measuring parameters such as acceleration, stresses or strains, and pressure, in communications and in other fields. SAW device sensors generally are based on the propagation of surface acoustic waves across a thin, flexible diaphragm which is deformed when subjected to an applied acceleration, stress or strain, or pressure. They measure the effects of the parameter of interest on properties of the surface acoustic wave and use this measurement to deduce the parameter of interest. In communications and in other fields, surface acoustic wave devices are used in a variety of signal processing applications. Various uses of SAW device sensors are discussed in commonly owned U.S. Pat. Nos. 4,419,600 granted on Dec. 6, 1983 for a Stress-Compensated Quartz Resonator and 4,512,198 granted on Apr. 23, 1985 for Surface Acoustic Wave Sensors, and in co-pending commonly owned patent applications Ser. No. 427,240 (filed on Sept. 29, 1982) and Ser. Nos. 687,715 and 687,716 (both filed on Dec. 31, 1984). Said commonly owned patents and co-pending patent applications are hereby incorporated by reference in this specification, as though fully set forth herein, and the Examiner's attention is directed to the background portions of their disclosures, and to the prior art discussed or cited therein. See, also, U.S. Pat. Nos. 3,771,072; 3,772,618; 3,818,382, 3,866,153; 3,995,240; 4,109,172; 4,109,173; 4,220,888; 5,224,548; 4,224,549 and 4,323,809.

One of the desirable and important characteristics of SAW devices is their frequency stability. However, frequency stability can be adversely affected by environmental factors, which are manifested primarily in various types of biasing states or stress distributions in the surface along which the acoustic wave propagates. For example, temperature-induced strain and acceleration-induced body forces, in conjunction with mounting support forces, can result in an undesirable frequency drift. A need exists to make SAW devices more immune to environmental factors, and important aspect of the invention are directed to meeting at least some aspects of that need.

It has been recognized that the selection of crystalline orientation and direction of propagation of surface acoustic waves in a SAW device can have a significant effect on the way environmental factors affect frequency stability. While it may be possible to deduce a desirable crystalline orientation and direction of propagation with respect to certain environmental factors, for example through the use of simulations involving linear relationships of wave motion, there are certain environmental factors which are not in that category. For example, temperature-induced effects and stress-induced effects on the surface wave propagation are believed not to be susceptible to a solution based on linear equations of motion. Nevertheless, temperature effects and stress effects can be of significant importance for frequency stability.

One configuration which is believed to be widely used in the art involves using quartz plates in the so-called ST-cut. Another uses the so-called SST-cut. Using the standard adopted by the Institute of Radio Engineers, now the Institute of Electrical and Electronic Engineers or IEEE which appear in "Standards on Piezoelectric Crystals, 1949: Standard 49 IRE 14.S1." Proceedings of the IEEE, December 1949, pp. 1378–90, the ST-cut is characterized by an angular orientation theta of 42.75° and propagation direction gamma of 0°, and the SST-cut is characterized by an angular orientation of −49.22° and propagation direction gamma of 23°. It is believed that the commonly used ST-cut SAW devices do not provide adequate compensation (at least in some applications) for stresses such as planar, isotropic stress distributions in the plane of the device, or for biaxial stresses due to a flexural loading of the substrate, and provide compensation only over a very narrow bandwidth for periodic, thermal stress distributions due to an array of metallic electrode stripes. It is also believed that ST-cut SAW devides are significantly affected by dynamic thermal effects. Similar, but not identical, shortcomings are believed to be associated with SST-cut SAW devices. See, also, U.S. Pat. No. 4,499,395 which proposes certain other cuts.

One aspect of the invention is based on the discovery that unexpected significant improvement in stress compensation and temperature compensation is SAW devices can be achieved by using a different cyrstalline orientation and a different propagation direction than is known to have been used before for such devices. In particular, an important aspect of the invention is the discovery of a new cut, called herein the STC-cut (standing for stress and temperature compensation cut), characterized by an angular orientation and a propagation direction different from those known to have been used in the prior art for such devices. A SAW device utilizing the STC-cut provides, as compared with an ST-cut device, high SAW velocity, lower viscous attenuation, lower dynamic thermal effects, greater compensation for planar isotropic stress in the plane of SAW propagation and for biaxial stresses due to flexural loading, and compensation over a larger bandwidth for periodic thermal stress distribution due to an array of electrode stripes. In an exemplary and nonlimiting embodiment, the STC can be characterized by a propagation direction gamma=46.9° ma=46.9° and an angular oriengation theta=41.8°, using the IEEE standard notation referred to above. Other important aspects of the invention are discussed in the detailed description below.

BRIEF DESCRIPTION OF THE DRAWINGS

FIG. 9a illustrates schematically a cross-section of a thin circular disc with a SAW delay line (or resonator) thereon; FIG. 9b illustrates a plan view of the same disc subjected to a pair of diametrical forces acting at an azimuthal angle psi; and FIG. 9c illustrates tthe force-frequency effect for the STC-cut quartz substrate (theta=41.8°, gamma=46.9°).

FIG. 10a is a schematic plan view of a two-port SAW resonator; FIG. 10b is a cross-sectional view of a portion of the resonator showing a periodic array of electrodes; and FIG. 10c is a graph showing the periodic stress distribution in the alternating unplated and plated regions of the same resonator.

FIG. 14a is a graph illustrating thermal stress induced frequency shifts as a function of the wavelength-to-periodicity ratio for a SAW device using the ST-cut; and FIG. 14b is a similar graph for a SAW device using the STC-cut.

FIG. 15a is a graph illustrating thermal transient response of a saw resonator on a ccut close to ST-cut when the external surface of the device is subjected to an exponential temperature rise; and FIG. 15b is a similar graph for the STC-cut.

DETAILED DESCRIPTION

Figure 1:
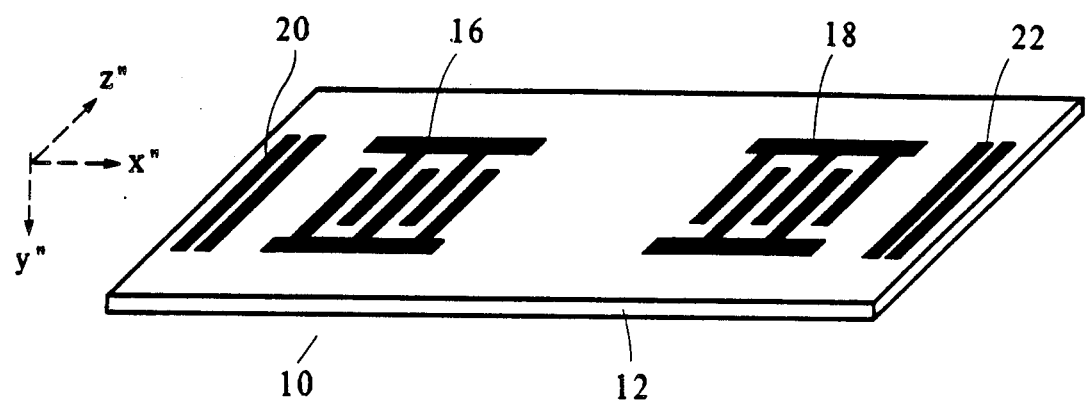
FIG. 1 illustrates in schematic form a SAW device in the form of a two-port SAW resonator.
Figure 2:
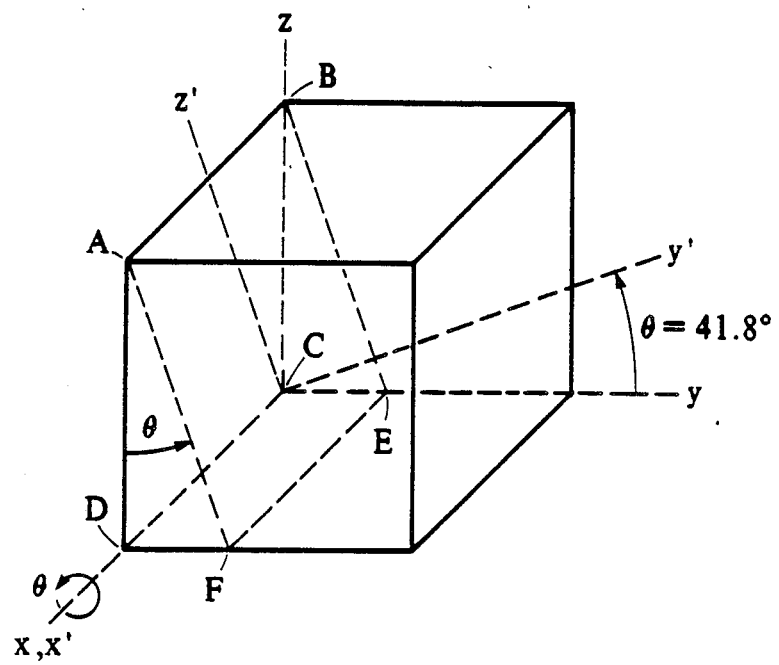
FIG. 2 illustrates a cube of a crystal, such as quartz, and relevant IEEE standards notation used herein to define angular orientation.

Referring to FIG. 1, a SAW device 10 comprises a substrate 12 of a material such as single crystal (or substantially single crystal) quartz. On one of its flat faces substrate 12 has a pair of surface wave interdigital transducers 16 and 18 and surface wave grating reflectors 20 and 22. This SAW device is a two-port SAW resonator in which a standing wave is set up. A similar structure can be used as a SAW delay line, as is known in the art. If the device is to be used as a part of a sensor to measure a parameter such as pressure, substrate 12 can be mounted on a support which allows it to flex as pressure is applied, with a resultant change in the standing wave frequency. The frequency change can be used as a measure of applied pressure. Alternately, substrate 12 can be an integral part of a structure, such as a cylinder, which is subjected to pressure, with similar effects on frequency. The illustrated substrate 12 has a top surface which is in the plane of the X"Z" axes and is normal to the Y" axis. The surface acoustic wave propagates along the X" axis. The significance of the coordinate system is illustrated in FIG. 2, where the shown exemplary cube 24 of (substantially) single crystal quartz has crystallographic axis X, Y and Z. The X axis is the digonal axis, as defined in said IEEE standard, and the Z axis is the trigonal axis. If a surface ABCD, which is normal to the Y axis, is rotated about the X axis such that it assumes the position ABEF, in which it is normal to the Y' axis, the surface ABEF is referred to as a rotated Y cut, and is defined by its "angular orientation," i.e., the angle theta between the Y axis and the Y' axis. In the case of the commonly used ST-cut, theta=42.75°, and in the SST-cut theta=49.22°. In one nonlimiting example of the STC-cut discovered as an important aspect of this invention, theta=41.8°, and the propagation direction gamma (discussed in connection with FIG. 3 below) is 46.9°.

Figure 3:
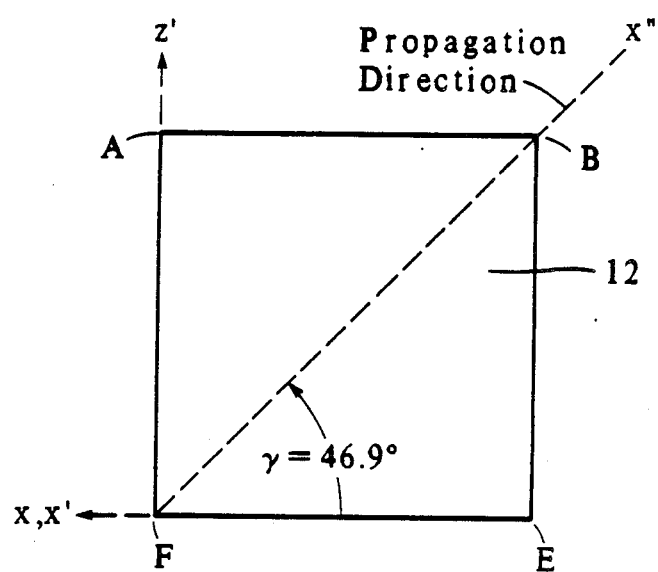
FIG. 3 illustrates a section through the cube of FIG. 2 and the IEEE standards notation used herein to define propagation direction.

FIG. 3 shows a plan view of an STC substrate having large faces normal to the Y' axis of FIG. 2. Edges AB and EF are parallel to the crystallographic X axis (the digonal axis) and edges AF and BE are parallel to the Z' axis, which has been rotated about the X axis away from the crystallographic Z axis (the trigonal axis) through the angular orientation angle theta, which in the case of the exemplary STC-cut discussed here is 41.8°. The propagation direction gamma selected in accordance with the a nonlimiting example of the invention for the STC-cut is 46.9°. This is the angle between the crystallographic X axis and the X" axis. The X" axis is the direction along which the surface acoustic wave will propagate in the SAW device. In the schematic illustration of FIG. 1 it is the direction X" along which the standing wave travels between transducers 16 and 18. In the commonly used ST-cut, gamma=0°, i.e. the surface acoustic wave propagates along the crystallographic X axis, and in the SST-cut gamma=23°. Once the propagation direction X" is selected, a substrate 12 can be cut in any convenient shape suitable for mounting. For example the rectangular plate 12 illustrated in FIG. 3 can be cut to form the substrate 12 of FIG. 1. Of course, shapes other than rectangular can be used, for example discs, or the surface along which the SAW propagates can be a part of a more complex structure, such as a cylinder. The substrate illustrated in FIGS. 2 and 3 is a rotated Y cut, with the angle phi between the X axis and the X' axis being zero (i.e., the Y and Z axes are rotated about the X axis to assume the Y' and Z' positions, and the X and X' axes coincide).

Certain significant differences between a SAW device based on the invented STC-cut and a SAW device using the conventional ST-cut are identified in the following Table 1 (based on modeled estimates rather than side-by-side tests of actual SAW devices), and are discussed in more detail in the remainder of this specification.

TABLE 1
PROPAGATION CHARACTERISTICS OF THE STC AND ST-CUTS

| Orientation: | $\phi = 0, \theta = 41.80°$ | $\phi = 0, \theta = 42.75°$ |
|---|---|---|
| Propagation Direction: | $\gamma = 46.89°$ (STC-cut) | $\gamma = 0°$ (ST-cut) |
| Velocity: | 3288.66 m/sec | 3158 m/sec |
| Power Flow Angle: | −6.5° | 0° |
| $\frac{\Delta V}{V}$ {Electromechanical Coupling Coefficient} | $4.75 \times 10^{-4}$ | $5.8 \times 10^{-4}$ |
| Viscous Attenuation: | 6 dB/cm at 1 GHz | 6.7 dB/cm at 1 GHz |
| Turnover Temperature: | 23° C. | 23° C. |
| Temperature Coefficient of Delay: | $\frac{\Delta \tau}{\tau \Delta T} = 0$ | 0 |
| Dynamic Thermal Effects: | 18% lower than ST-cut | |
| Compensated for: | | |
| (1) planar, isotropic stress distribution in the plane of the device | Yes | No |
| (2) Periodic, thermal stress distribution due to an array metallic electrode stripes | Over a larger bandwidth | Over a very narrow bandwidth |
| (3) Biaxial stresses due to a flexural loading of the (thin) substrate | Yes | No |

As illustrated in Table 1 above, the SAW velocity of a device based on the new, STC-cut is higher than for the conventional ST-cut, which means among other things that higher frequencies can be achieved, with attendant lower material attenuation. The power flow angle no longer coincides with the propagation direction, but this can be accounted for as needed. The electromechanical coupling coefficient, which is a measure of the coupling between the interdigital transducers and the quartz substrate, is slightly lower but still sufficient for suitable transfer of energy. The viscous attenuation is significantly reduced in the case of the invented STC-cut, with attendant performance benefits. Importantly, the dynamic thermal effects are significantly lower for the STC-cut than for the common ST-cut. In terms of stress compensation, the STC-cut provides compensation for planar isotropic stress distributions in the plane of the device (the plane of propagation of the surface acoustic wave) and for biaxial stresses due to a flexural loading of the substrate, while the common ST-cut is believed not to provide such compensation to any significant degree. With respect to compensation for periodic thermal stress distribution due to an array of metallic electrode stripes (the interdigital transducers) the STC-cut provides compensation over a significantly larger bandwidth than in the case of the commonly used ST-cut.

By way of a background, it is believed that the transient thermal response of quartz SAW resonators is an important contributing factor to medium term frequency stability. Even when a quartz resonator is ovenized to operate near its turnover temperature (in order to achieve maximum frequency stability), small thermal transients, temperature excursions and cyclings are not completely avoided. The resulting temporal temperature gradients in the quartz substrate produce undesired frequency excursions which can limit the performance of high precision SAW devices. SAW resonators often are fabricated on rectangular or circular substrates. These substrates are packaged and vacuum sealed in various types of enclosures which significantly affect the heat transfer characteristics of the device. The interaction of straight crested surface waves with temperature gradients parallel as well as normal to the propagation direction, are believed to be the two major causes of transient frequency excursions in SAW resonators. If the temperature gradient parallel to the propagation direction is symmetric about the center of the SAW device, then the temperature gradient normal to the substrate and to the surface wave propagation direction can become the dominant source of thermal transients.

In addition to the thermal transients discussed above, the interdigital transducers can also contribute to thermal effects. A SAW resonator typically employs either one or two interdigital transducers for the generation and/or detection of surface acoustic waves in the resonant cavity formed by an array of reflecting grooves or metallic stripes at the ends of the device. An interdigital transducer has a periodic array of stripes, usually of aluminum, whose thermal expansion coefficient is different from that of quartz. Consequently, a change in the temperature of the composite structure can result in a thermal stress distribution in the quartz substrate. This, in turn, can result in an undesired shift in the SAW frequency. It is believed that the electroded portion of the SAW device surface contributes more to the hysteresis and nonrepeatability of the device characteristics than the unclad surface under temperature cycling. It is believed that this occurs primarily because the substrate crystal (e.g. quartz) is more elastic than the polycrystalline electrodes (typically metallic) under temperature-induced deformations or deformations due to an externally applied load. It is also believed that whenever a thin electrode film is deposited on a substrate such as quartz, intrinsic stress in the film results in a biasing deformation state of the substrate, which in turn can cause a change in the resonator frequency. Furthermore, there is a slow relaxation of the intrinsic stress in the film and biasing state of the adjoining substrate, which can be a major contributing factor to the long-term drift (or aging) of the resonator characteristics. However, it has been discovered that biasing deformation states of the substrate possess similar stress distributions due to either the intrinsic stress in the periodic electrode fingers or thermal stress due to the difference in the thermal expansion coefficients as between the electrodes and the substrate. Thus, it is of interest to search for orientations and propagation directions which are as insensitive as practicable under the circumstances to the periodic stress distributions in the substrate arising due to the electrode pattern of either interdigital transducers or reflecting stripes. An orientation which is substantially insensitive to such stress distributions can exhibit improved aging characteristics of high precision SAW devices by reducing the effect of the relaxation of electrode stresses on the frequency stability of the device.

Another factor of interest to frequency stability, and particularly medium term stability, is acceleration stresses. SAW devices can be used in high shock and vibration environments which can cause acceleration-induced frequency shifts. An externally applied acceleration field can result in distributed body forces throughout the SAW device substrate, along with the reactions from mounting supports. Thus, acceleration sensitivity of SAW devices can be affected by not only the acceleration direction and crystalline orientation of the device, but also by the design of mounting supports. In general, it is desirable for a SAW device to have maximum insensitivity to accelerations in arbitrary directions. Short of achieving this goal, it is generally of importance to select crystalline orientations and propagation directions which significantly reduce the acceleration sensitivity of SAW devices to accelerations in a direction normal to the plate substrate because thin plates are most susceptible to large flexural deformations when subjected to a normal acceleration field.

Yet another factor of interest to frequency stability is bonding and mounting stresses. Generally, SAW devices employ thin plate-like structures as the propagating medium of the surface acoustic waves. There are various ways of bonding a crystal (plate) substrate to an enclosure and mounting it to a holder. Each configuration may lead to a different stress distribution in the vicinity of the SAW device. However, any stress distribution through the thickness of the plate can be expressed in terms of an extensional (symmetric) and flexural (anti-symmetric) deformations. Thus, any crystalline orientation and propagation direction of surface acoustic waves which is compensated for these two types of stress distributions can result in a vastly reduced sensitivity of device performance to such environmental factors. An exemplary configuration of a SAW device employing the new STC-cut described in detail here can be in the form of a thin disc. The device can have an all-quartz enclosure by vacuum-sealing it with another disc of the same crystalline orientation. The bonding agent can be vitrifying or de-vitrifying glass frits of thermal expansion coefficient approximately the same as that of quartz. The bonding layer can be in the form of a circular ring along the peripheries of the discs. This flat-pack type of enclosure can have ring supports on both exposed faces of the discs. This mounting can substantially reduce the sensitivity of a SAW resonator (or a delay line) to accelerations acting primarily normal to the disc surfaces, provided the crystalline orientation employed is suitably compensated for the biaxial stresses resulting from a flexural deformation of the discs.

In order to illustrate certain characteristics of an STC-cut SAW device which is a nonlimiting example of the invention, computational results have been obtained by modelling such a device and are illustrated as discussed below. The exemplary SAW device discussed in connection with the computational results below is a rotated Y-cut quartz substrate (theta=41.8°).

Figure 4:
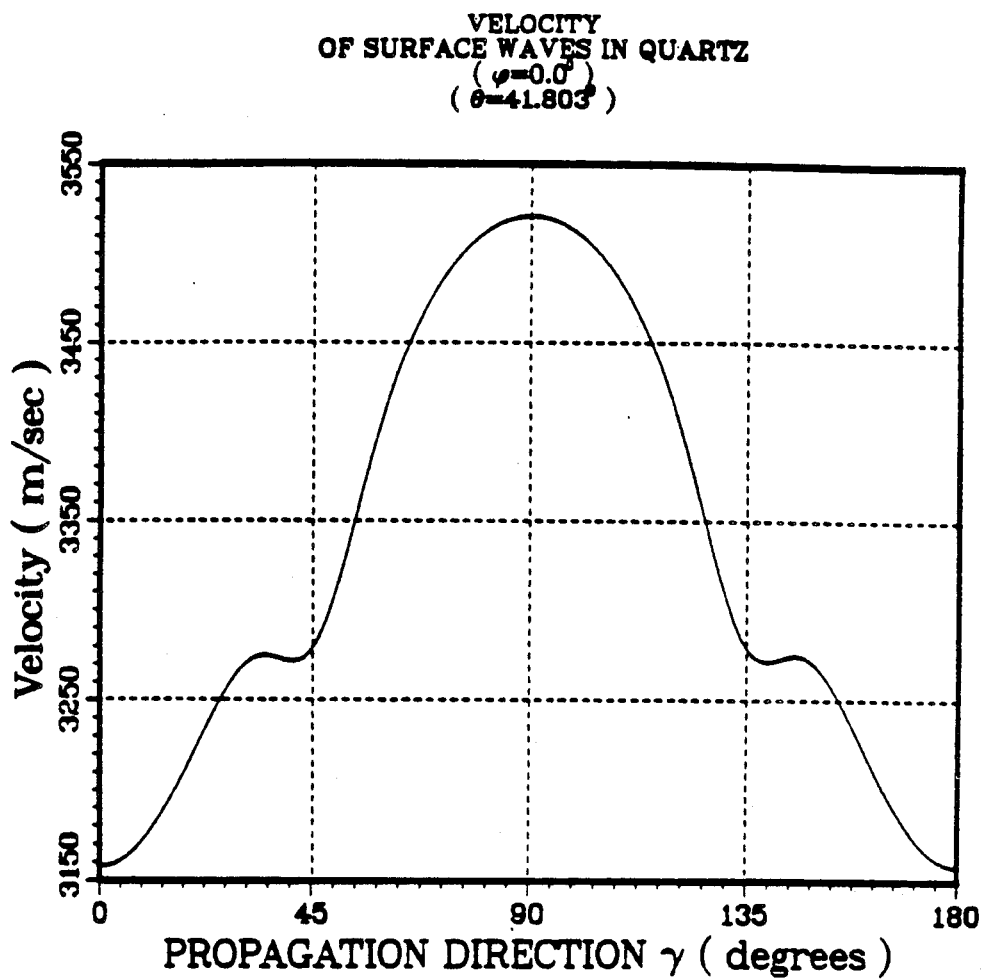
FIG. 4 is a graph showing the velocity of a SAW on a rotated Y cut (theta=41.8°) substrate as a function of the propagation direction gamma.
Figure 5:
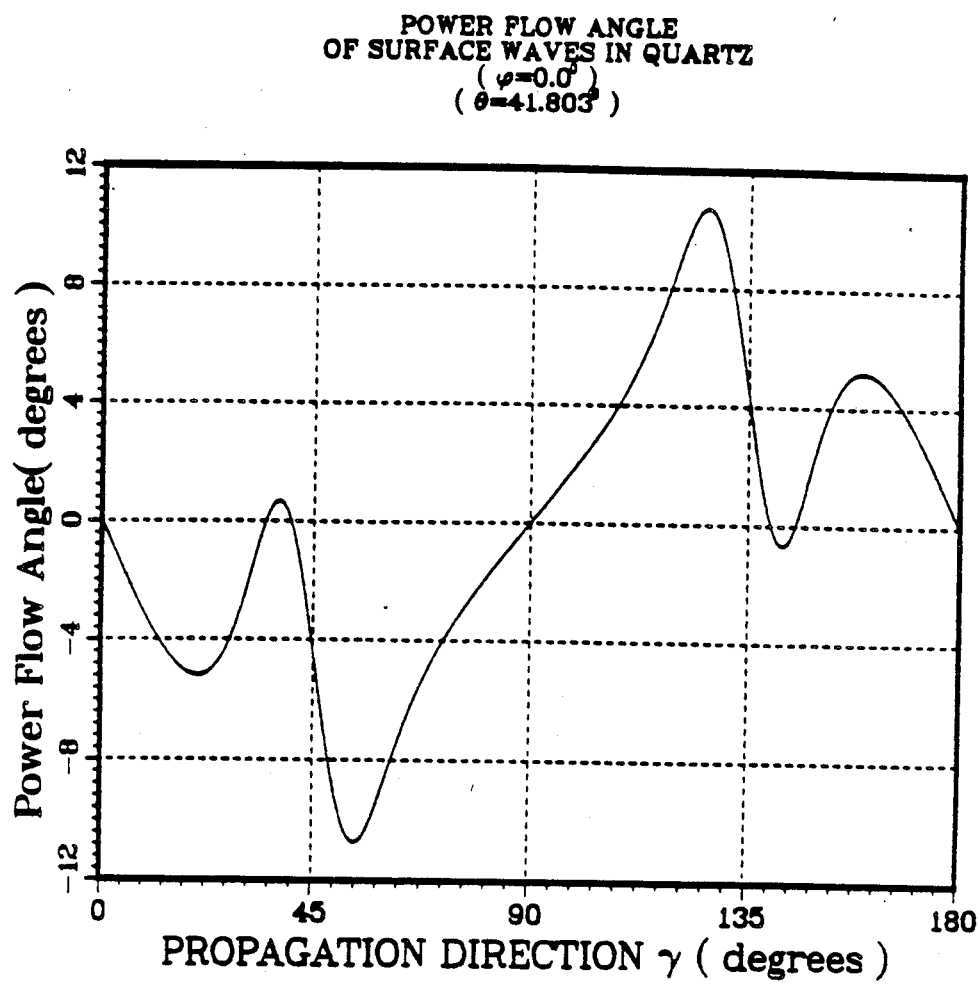
FIG. 5 is a graph illustrating the power flow angle as a function of the propagation direction gamma.
Figure 6:
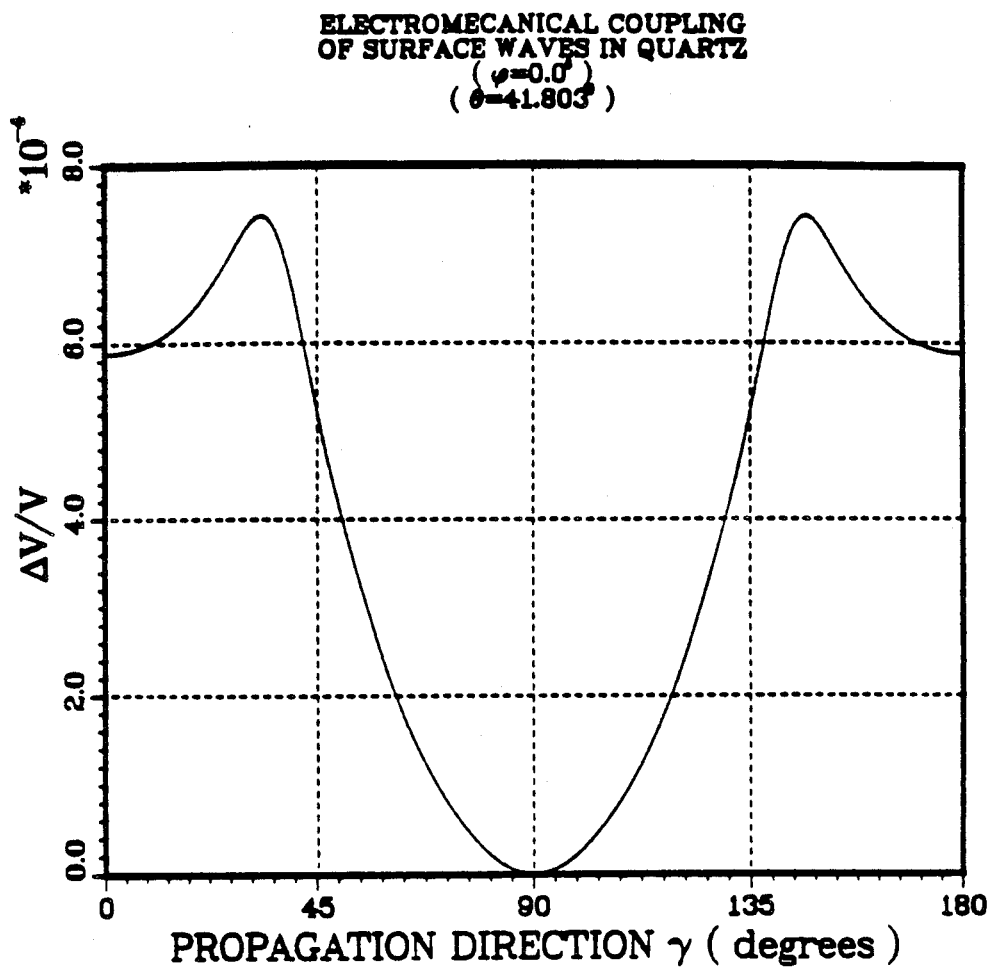
FIG. 6 is a graph showing velocity changes of surface waves due to an infinitesimally thin conducting film on the quartz substrate as a function of the prropagation direction gamma.

FIG. 4 illustrates the SAW velocity in m/sec as a function of the propagation direction gamma in degrees measured from the digonal axis of the crystal, FIG. 5 illustrates the power flow angle in degrees of offset from the propagation direction gamma as a function of the same propagation direction, and FIG. 6 illustrates the change in velocity due to an infinitesimally thin conducting film on the quartz substrate (which is a measure of electromechanical coupling of surface waves in quartz) also as a function of the same propagation direction. As seen in FIG. 4, velocity is highest at propagation normal to the digonal axis. While high velocity is desirable, among other reasons because it means lower material attenuation and because FIG. 5 shows a good power flow angle of 0° for propagation at 90° to the digonal axis, FIG. 6 suggests that a propagation direction in the vicinity of 90° is impractical, because the electromechanical coupling for such propagation angles is too low. FIG. 4 also suggests that a propagation direction in the vicinity of 45° can be desirable, because the velocity is reasonably high and the curve is not too steep, which can mean that high accuracy in the propagation direction may not be critical, i.e. that a SAW device having a propagation direction in the vicinity of 45° would be less sensitive to manufacturing errors in the propagation direction than, for example, a device having a propagation direction in the vicinity of 60°, where the curve of FIG. 4 is much steeper. FIG. 5 suggests that the power flow angle indicated for the vicinity of 45° propagation direction can be accommodated in the design of a SAW device, and FIG. 6 suggests that the electromechanical coupling for a propagation direction in the vicinity of 45° would be satisfactory if suitably accounted for.

Figure 7:
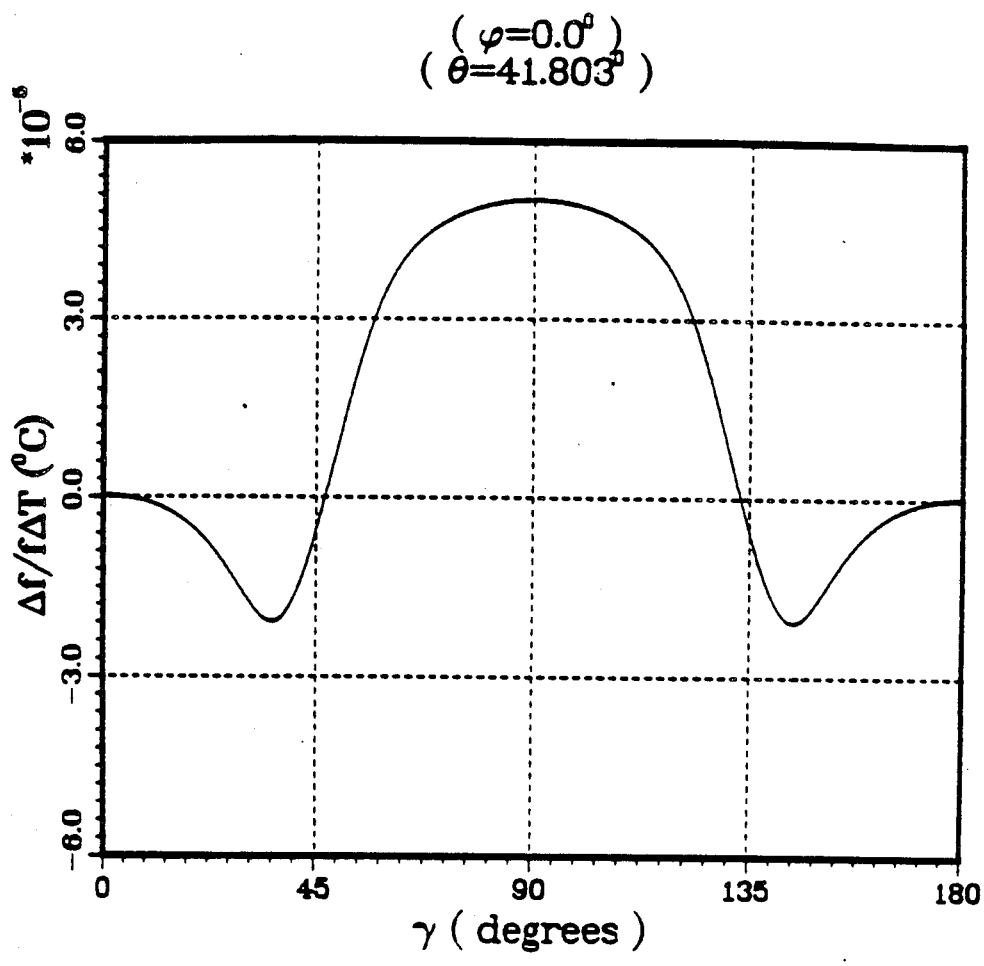
FIG. 7 is a graph showing temperature induced fractional changes in the frequency of a SAW resonator as a function of the propagation direction gamma.

FIG. 7 illustrates a characteristic of particular importance—temperature-induced frequency shifts in a SAW device as a function of propagation direction. According to the modelled computational results discovered in the course of making this invention and illustrated in FIG. 7, temperature-induced frequency shift is at zero in the vicinity of a propagation direction of 0° and a propagation direction of slightly over 45° (and the curve is symmetrical about the 90° point). As between these two propagation directions that which is slightly above 45° is preferable because, among other reasons, it gives a higher SAW velocity. FIG. 7 shows the modelled and computed fractional change in an STC-cut SAW resonator frequency due to a 1° C. change in temperature from a reference of 23° C.

Figure 8:
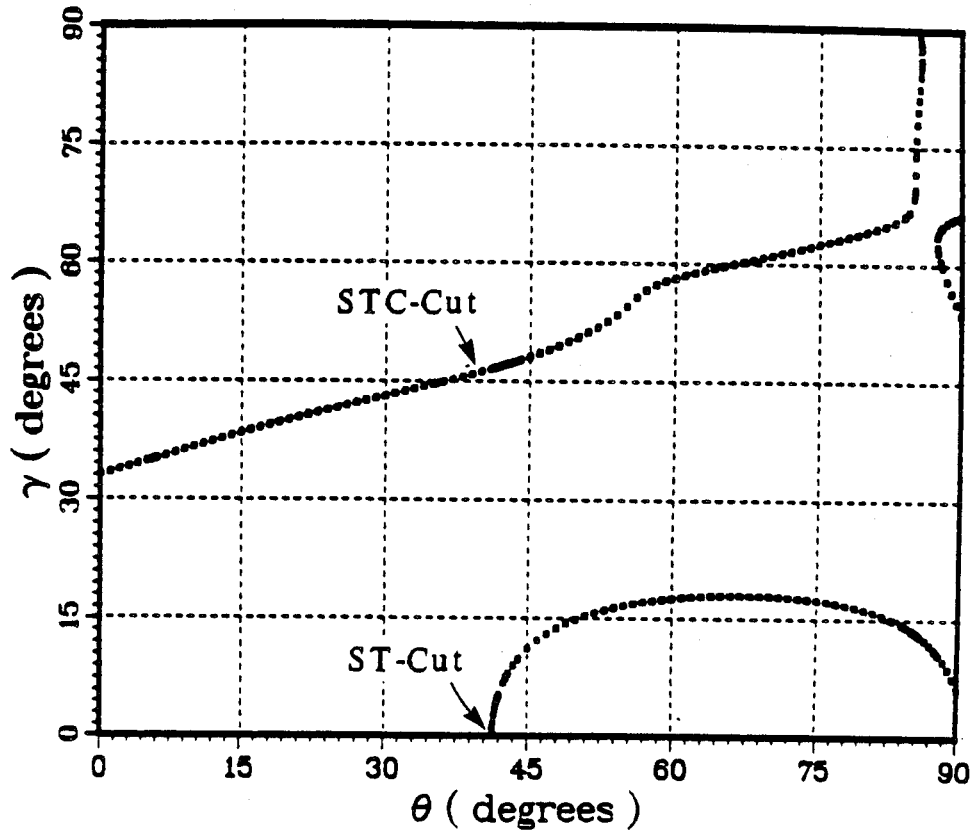
FIG. 8 is a graph illustrating the loci of orientations and propagation directions of surfae acoustic waves with zero first order temperature coefficient of delay at 23° C.

Referring to FIG. 8, the curves illustrate the loci of orientations and propagation directions for zero temperature coefficient of delay at a reference temperature of 23° C. Each point on the curves corresponds to an angular orientation for a rotated Y-cut quartz substrate and a propagation direction for a SAW device at which there is a zero first order temperature coefficient of delay. The loci for the invented STC-cut and the conventional ST-cut are indicated by the respectively labelled arrows.

The modelled effects of a planar stress distribution in the plane of an STC-cut SAW device due to externally applied forces are illustrated in FIGS. 9a–9c and lead to the conclusion that an isotropic distribution of such planar stress should not induce frequency changes. FIG. 9a is a schematic cross-section of a thin circular disc with a SAW delay line (or resonator) on its top surface, and FIG. 9b is a top plan view of the disc. The illustrated SAW device uses the invented STC-cut, and the coordinate system illustrated in FIGS. 9a and 9b is the same as that used in FIGS. 2 and 3. FIG. 9c illustrates the force-frequency effect due to an externally applied force F which, as illustrated in FIG. 9b, comprises a pair of diametrical forces F acting on the SAW device disc at an azimuthal angle psi. As seen from the modelled and computed results of FIG. 9c, the area under the curve vanishes, and the mean force-frequency coefficient for this orientation is zero.

A SAW resonator generally employs either one or two interdigital transducers for the generation and detection of surface acoustic waves in the resonant cavity formed by an array of reflecting grooves or metallic stripes at the ends of the device, as illustrated in FIGS. 10a and 10b. An interdigital transducer has a periodic array of metallic stripes (usually of aluminum) which are sometimes called electrode fingers and whose thermal expansion coefficient is different from that of quartz. Consequently, a change in the temperature of the composite structure of the SAW device can result in a thermal stress distribution on the quartz substrate which, generally, can result in a shift in the SAW device frequency. The modelled biasing stress pertaining to a periodic array of electrodes on a substrate in the case of an ST-cut SAW device is illustrated in FIG. 10c, where the vertical axis is a measure of the stress component along the direction of SAW propagation and the horizontal axis is distance along the SAW propagation direction, in microns. A wavelength is approximately 10 microns in this example. It is seen from FIG. 10c that the stress component is significantly less for the clear or unclad portion of the quartz, i.e. the portion which is between electrode fingers, than for the electroded portion of the quartz, i.e. the portion which is under an electrode finger. A presentation such as in FIG. 10c is of interest in the search for orientations and propagation directions which are as insensitive as possible under the circumstances to the periodic stress distributions in the quartz substrate arising from the electrode pattern of either interdigital transducers or reflecting metallic stripes. A SAW device which is less sensitive to such periodic stress distributions can be expected to exhibit improved aging characteristics, because the effect of the relaxation of electrode stresses on frequency stability should be less than in the cuts known prior to this invention.

Figure 11:
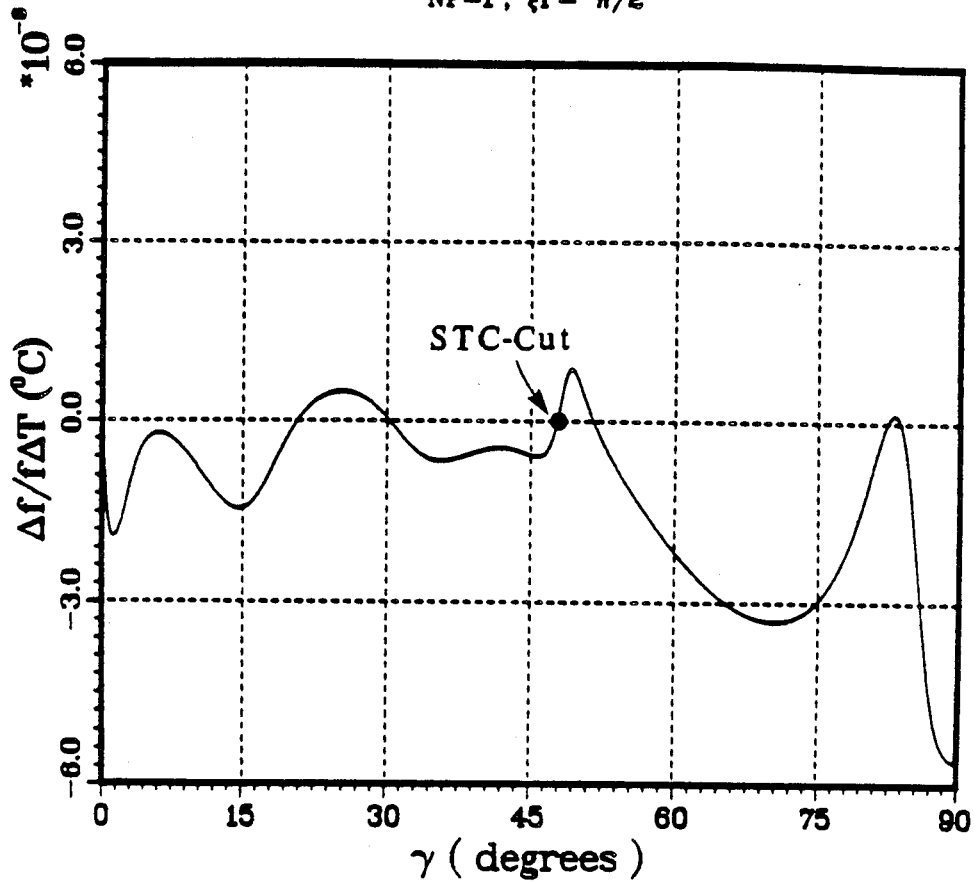
FIG. 11 illustrates thermal stress induced frequency shifts in a SAW resonator on a rotated Y cut substrate (theta=41.8°) as a function of the propagation direction gamma.

The modelled thermal stress induced frequency shifts in a SAW device due to an infinite array of aluminum electrode stripes on a substrate with a rotation angle theta=41.8° is illustrated at FIG. 11 as a function of the propagation direction gamma measured from the digonal axis. The propagation direction of surface waves is considered always to be normal to the length of the metallic stripes in the interdigital transducers which are employed for the generation and detection of such waves. The graph of FIG. 11 is for the resonance (synchronous) frequency of the SAW device having the indicated characteristics. It is seen that for the STC-cut of gamma=46.9° the thermal stress induced frequency shift is zero for the conditions illustrated in FIG. 10.

In fact, the modelled SAW devices have thermal stress induced frequency shifts of zero at the fundamental resonance frequency at a number of combinations of rotation angle (angular orientation) theta and propagation direction gamma. This is illustrated for a particular modelled SAW device in FIG. 12, where each of the curves comprises loci at which the thermal stress induced frequency shifts are zero at the fundamental resonance frequency.

Figure 12:
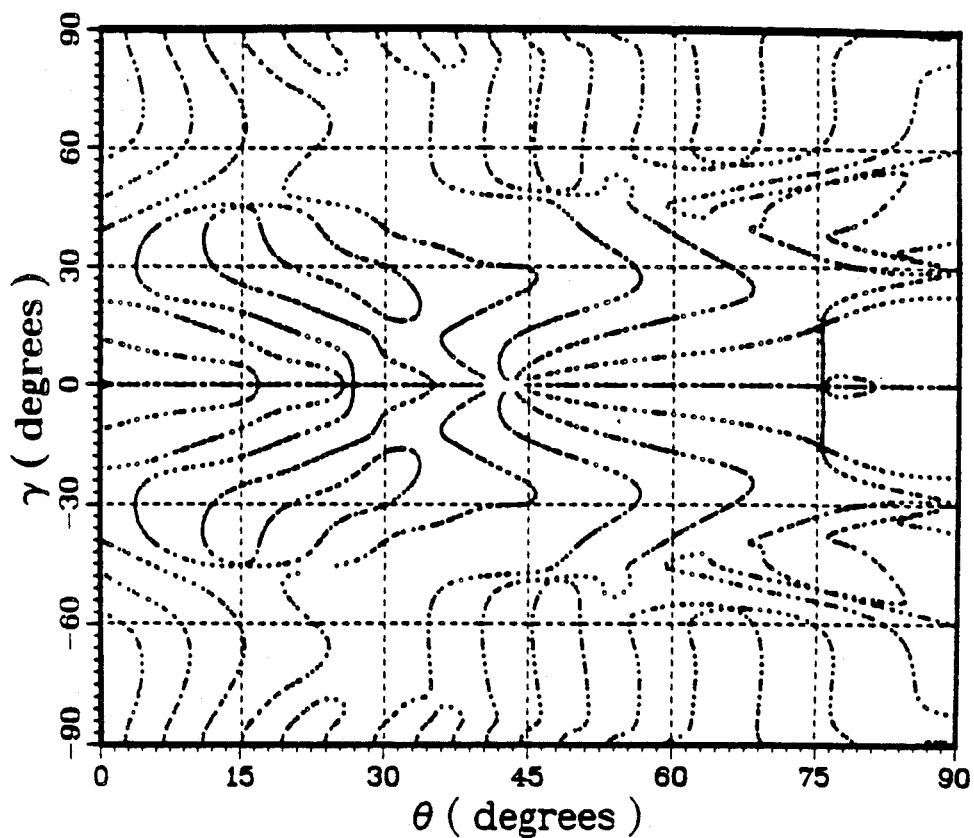
FIG. 12 illustrates loci of orientations and propagation directions exhibiting thermal stress compensation at the resoonance frequency.
Figure 13:
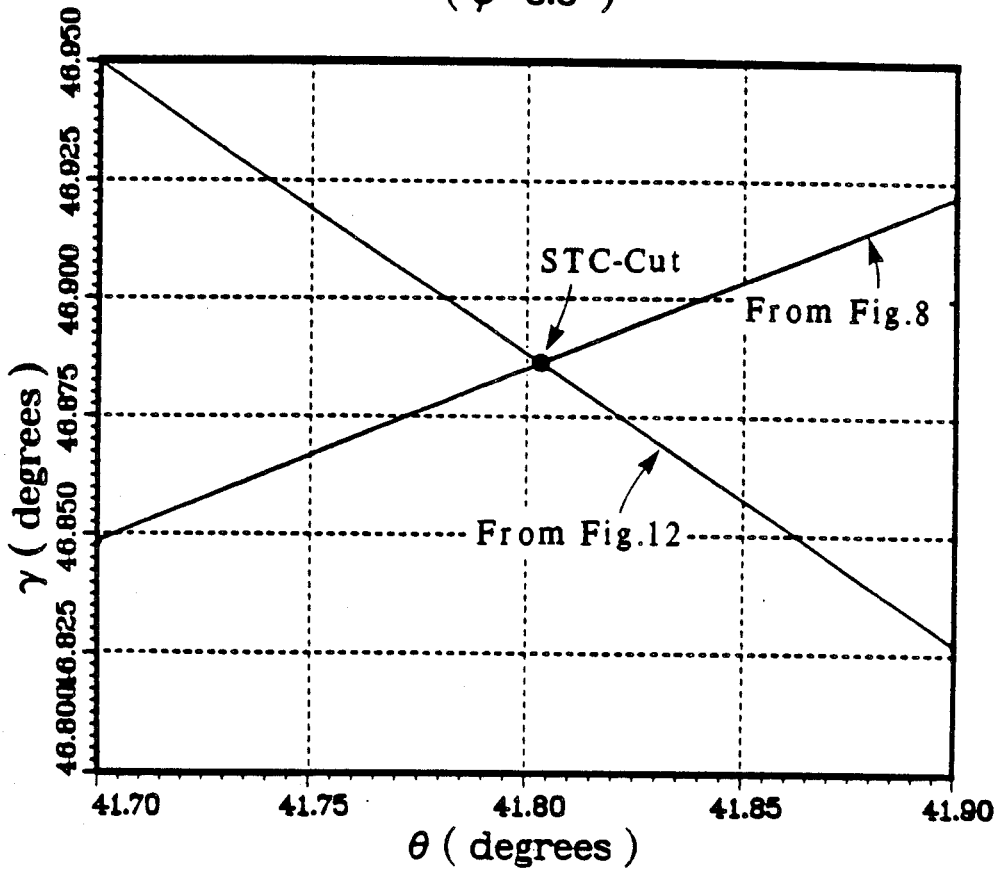
FIG. 13 illustrates temperature and stress compensated loci in the neighborhood of the angular orientation and propagation direction characterizing an STC-cut substrate.

The new, STC-cut exhibits modelled temperature and stress compensation for zero frequency shift, as illustrated in FIG. 13, which is an expanded scale combination of the portions of FIG. 8 and FIG. 12 most pertinent to the STC-cut. It is seen that for an angular orientation theta of 41.803° and propagation direction gamma of 46.886° there is an intersection of the loci for zero temperature frequency shift and for zero thermal stress frequency shift. The modelled results of FIG. 13 indicate that for the STC-cut the SAW device should be substantially insensitive to the periodic thermal stresses resulting from an infinite array of metallic stripes.

FIGS. 14a and 14b compare the modelled thermal stress induced frequency shifts in the commonly used ST-cut and the new, STC-cut SAW devices, plotted as a function of the ratio of wavelength to periodicity. At the fundamental resonance frequency, this ratio of wavelength to periodicity is approximately two for the commonly used ST-cut. Many if not most of the applications of crystal resonators require insensitivity to thermal stresses over a certain bandwidth, and not only at the resonance frequency. It is clear from FIGS. 14a and 14b that the new, STC-cut SAW device exhibits significantly reduced thermal stress induced frequency shifts over a wider bandwidth than is the case with the commonly used ST-cut. Note that in terms of vertical axis units the graph of FIG. 14a for the commonly used ST-cut extends over a range of about 27 units while that for the new, STC-cut extends over a range of less than four units, giving significantly wider bandwidth and thus providing significant operational benefits over the conventional ST-cut.

FIGS. 15a and 15b compare the commonly used ST-cut and the new, STC-cut in terms of thermal transient response. The thermal transient response curves are for the substrate thickness of 1 mm. and when the external surface of the device is subjected to an exponential temperature rise given by $[1-\exp(-\beta t)]$. Curves 1, 2 and 3 in each of FIGS. 15a and 15b are for three different resonance frequencies. The modelled results of FIGS. 15a and 15b indicate that the new, STC-cut, exhibits lower magnitude of thermal transients than the commonly used ST-cut by about 18 percent, and thus brings about an important improvement in thermal transient response. In the expression for the exponential temperature rise, the variable t is time and the temperature rise is that of the external surface of the SAW device. The constant beta specified in FIGS. 15a and 15b is derived by fitting a curve to actual measurement.

Figure 16:
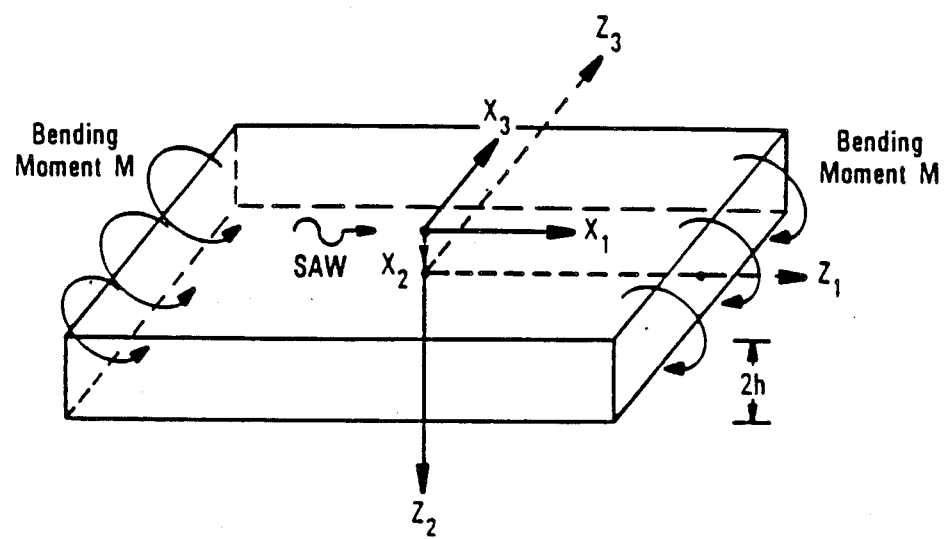
FIG. 16 is a schematic diagram of a rectangular substrate subjected to bending moments along a pair of parallel edges.
Figure 17:
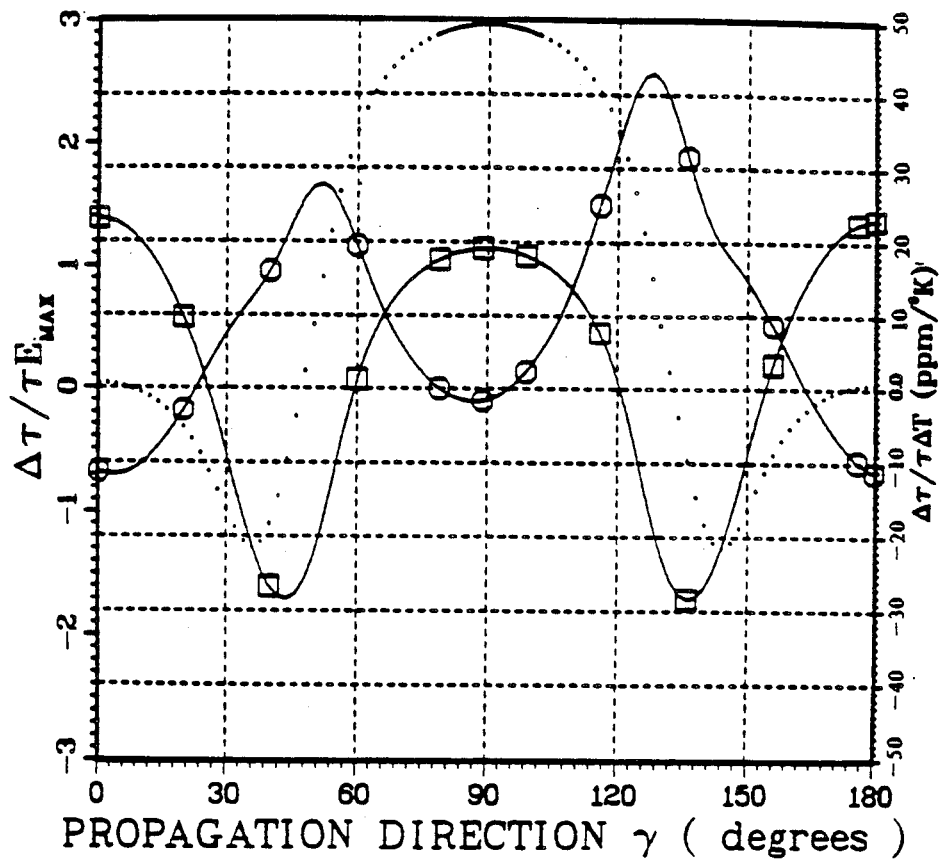
FIG. 17 is a graph showing fractional changes in time delay per unit maximum surface strain parallel and normal to the propagation direction on ST-cut substrate plotted as a function of propagation direction.
Figure 18:
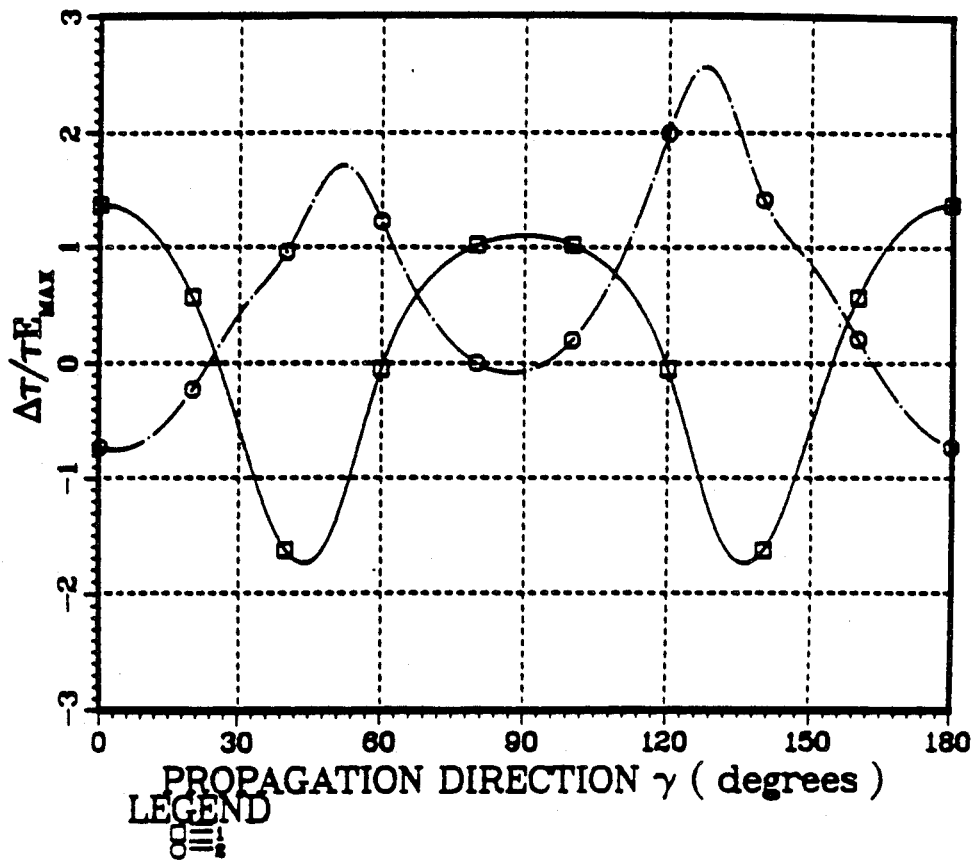
FIG. 18 is similar to FIG. 17 but is for an STC-cut substrate.

FIG. 16 illustrates a rectangular plate subjected to a uniform bending moment along a pair of its edges, and FIGS. 17 and 18 compare the bending moment induced frequency shifts in an ST-cut device (FIG. 17) and in the STC-cut device (FIG. 18). The fractional change in the time delay $(\Delta\tau/\tau)E_{max}$ in FIGS. 17 and 18 is simply negative of the fractional change in frequency per unit change in the maximum flexural surface strain $E_{max}$ due to bending. The curves connecting small squares pertain to flexural biasing stress parallel to the direction of propagation of the SAW, the curves connecting small circles pertain to flexural biasing stress perpendicular to the propagation direction, and the third curve in FIG. 17 is the superposition of first order temperature coefficient of delay. As seen from FIGS. 17 and 18 there is little or no compensation for biaxial stresses due to a flexural loading in the ST-cut (where the propagation direction gamma is zero degrees) but there is compensation for the STC-cut (where the propagation direction gamma is 46.9°). The fractional change in time delay referred to above $(\Delta\tau/\tau)$ is the negative of the fractional change in frequency $(\Delta f/f)$ of a resonator using the SAW device in question, and refers to the transit time between two observation points along the propagation direction gamma, where the observation points are fixed spatially. The quantity $E_{max}$ is the maximum flexural strain which will develop in bending a thin plate (see FIG. 16) and is a dimensionless quantity. It is used to normalize the fractional change in the time delay.

The STC-cut SAW devices can be used for highly stable SAW resonators and other SAW devices, particularly in a temperature controlled environment around the turnover temperature of approximately 23° C.

When used in conjunction with a SAW thermometer propagation direction on the same substrate, an STC-cut SAW device can provide a very stable high frequency reference source for downhole (well logging) frequency counting over a large temperature range. The SAW thermometer propagation direction on the substrate orientation for the STC-cut is at an angle of approximately 34.9° from the digonal axis. This orientation exhibits a large first order temperature coefficient of frequency of approximately 21 ppm per degree Centigrade at 23° C. This configuration can be used in a setting similar to the microprocessor controlled stable frequency source in the MHz range and over a large temperature range proposed by Slobodnik et al. in U.S. Pat. No. 4,489,289 granted on Dec. 18, 1984 and in 1981 Ultrasonics Symposium Proceedings, IEEE Catalog 81CH1689-9, pp. 135–138. The method proposed by Slobodnik et al. is based on a "crossed path" configuration and an ST-cut orientation rather than the new, STC-cut described here. Sufficiently away from the turnover temperature, a SAW device based on the STC-cut can be employed as a stable device for temperature measurements.

In summary, one major aspect of the invention is rotated Y-cut, quartz SAW device having a propagation direction gamma of 46.9° and an angular orientation theta of approximately 41.8°, measured using the IEEE standards referred to above. Other embodiments of the invention pertain to approximations of those angles gamma and theta and departures therefrom of 1°, 2°, 3° and 4°, to accommodate, e.g., manufacturing tolerances. Another aspect of the invention pertains to a rotated Y-cut, quartz SAW device having a propagation direction gamma and an angular orientation theta defined by a locus selected from the group of loci of FIG. 12 which, as discussed above, represents loci of gamma and theta which correspond to thermal stress zero frequency shift. It is noted that the conventional ST- and SST- cuts are not represented by loci on FIG. 12. Yet another aspect of the invention pertains to a SAW device in which gamma and theta are defined by a locus selected from the group of loci on the curve labelled STC-cut in FIG. 8, or at least approximately the angles gamma and theta corresponding to such a locus. Other aspects of the invention pertain to selecting gamma and theta to accomplish one or more of the advantages over an ST-cut device identified in connection with an STC-cut device in Table 1 above. Of course, it should be clear that many variations are possible within the scope of the invention, and that the invention is not limited to the particular, exemplary embodiments discussed above, and is defined only the the scope of the appended claims.

I claim:

1. A rotated Y-cut, quartz SAW device having a propagation direction gamma of approximately 46.9° and an angular orientation theta of approximately 41.8°.

2. A device as in claim 1 plus or minus 1° in gamma and theta.

3. A device as in claim 1 plus or minus 2° in gamma and theta.

4. A device as in claim 1 plus or minus 3° in gamma and theta.

5. A device as in claim 1 plus or minus 4° in gamma and theta.

6. A rotated Y-cut, quartz SAW device having a propagation direction gamma and an angular orientation theta defined by a locus selected from the group of loci of FIG. 12, which excludes gamma, theta angle combinations of approximately 0, 42.75; 23, 49.22; 45, 35.87; 135, 35.87 and 8–12, 43.

7. A device as in claim 6 plus or minus 1° in gamma and theta.

8. A device as in claim 6 plus or minus 2° in gamma and theta.

9. A device as in claim 6 plus or minus 3° in gamma and theta.

10. A device as in claim 6 plus or minus 4° in gamma and theta.

11. A SAW device having a propagation direction gamma and an angular orientation theta defined by a locus selected from the group of loci labelled STC-cut in FIG. 8.

12. A stress and temperature compensated SAW device having a propagation direction gamma and an angular orientation theta which are defined by a thermal stress induced frequency shift of substantially zero and a temperature coefficient of delay which also is substantially zero at reference temperature as defined in FIG. 13.

13. A device as in claim 12 having a power flow angle of −6.5° plus or minus 4°.

14. A device as in claim 12 comprising a substrate with a surface along which the SAW propagates and having a propagation direction gamma and an angular orientation theta selected for compensation for planar, isotropic stress distribution in said surface.

15. A device as in claim 14 having a propagation direction gamma and an angular orientation theta selected for compensation for periodic, thermal stress distribution due to an array of electrode stripes of a dissimilar material over a bandwidth which is large as compared with that for an ST-cut device.

16. A device as in claim 15 having a propagation direction gamma and an angular orientation theta selected for compensation for biaxial stresses due to a flexural loading of said substrate.

17. A device as in claim 16 having a SAW velocity substantially higher than that of an ST-cut device.

18. A device as in claim 16 having a viscous attenuation substantially lower than that of an ST-cut device.

19. A device as in claim 12 having a viscous attenuation substantially lower than that of an ST-cut device.

20. A device as in claim 12 having a SAW velocity substantially higher than that of an ST-cut device.

21. A device as in claim 12 having a propagation direction gamma and an angular orientation theta selected for compensation for periodic, thermal stress distribution due to an array of electrode stripes of a dissimilar material over a bandwidth which is large as compared with that for an ST-cut device.

22. A device as in claim 12 having a propagation direction gamma and an angular orientation theta selected for compensation for biaxial stresses due to a flexural loading of the device.

23. A device as in claim 12 comprising a rotated y-cut, quartz substrate along which the SAW propagates.

24. A device as in claim 23 in which the quartz is substantially single crystal.

25. A stress and temperature compensated SAW device comprising a rotated Y-cut, substantially single crystal quartz substrate having a major face and at least one transducer comprising an array of electrodes on said face of the substrate, wherein the propagation direction gamma of the SAW along said major face and the angular orientation theta of the major face are defined by a thermal stress induced frequency shift of substantially zero and a temperature coefficient of delay which also is substantially zero at reference temperature as defined in FIG. 13.

26. A SAW device comprising a rotated Y-cut, substantially single crystal quartz substrate having a major face and at least one transducer comprising an array of electrodes on said face of the substrate, wherein the propagation direction gamma of the SAW along said major face and the angular orientation theta of the major face are selected for stress compensation and for temperature compensation, and wherein the propagation direction gamma is approximately 46.9° and the angular orientation theta is approximately 41.8°.

27. A device as in claim 26 plus or minus 1° in gamma and theta.

28. A device as in claim 26 plus or minus 2° in gamma and theta.

29. A device as in claim 26 plus or minus 3° in gamma and theta.

30. A device as in claim 26 plus or minus 4° in gamma and theta.

31. A rotated Y-cut SAW device which has a propagation direction gamma and an angular orientation theta which are substantially at the intersection in the plot of propagation direction gamma vs. angual orientation theta as illustrated in FIG. 13 of (i) a curve in said plot of loci at which the device has substantially zero frequency shift at reference temperature, and (ii) a curve in said plot of loci at which the device has a substantially zero thermal stress frequency shift at reference temperature.

32. A SAW device as in claim 31 in which the curves intersect at approximately gamma=47° and theta=42° in said plot.

* * * * *